(12) United States Patent
Bae

(10) Patent No.: US 7,755,149 B2
(45) Date of Patent: Jul. 13, 2010

(54) PHOTO MASK AND SEMICONDUCTOR DEVICE FABRICATED USING THE SAME

(75) Inventor: Sang Man Bae, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 1243 days.

(21) Appl. No.: 11/165,179

(22) Filed: Jun. 24, 2005

(65) Prior Publication Data

US 2006/0118838 A1 Jun. 8, 2006

(30) Foreign Application Priority Data

Dec. 8, 2004 (KR) .................... 10-2004-0102882

(51) Int. Cl.
*H01L 29/78* (2006.01)
(52) U.S. Cl. ............... 257/401; 257/395; 257/E27.063; 257/E29.136
(58) Field of Classification Search .................. 257/401
See application file for complete search history.

(56) References Cited

U.S. PATENT DOCUMENTS 5,459,341 A * 10/1995 Shono et al. ................. 257/208
7,199,426 B2 * 4/2007 Ogura et al. ................. 257/321

* cited by examiner

*Primary Examiner*—Jerome Jackson, Jr.
(74) *Attorney, Agent, or Firm*—Townsend and Townsend and Crew LLP

(57) ABSTRACT

A photo mask and a semiconductor device fabricated using the same is disclosed. The photo mask to form a mask pattern defining a STAR gate region includes a transparent substrate, and a light-shielding pattern defining a zigzag W-STAR gate region, wherein a waved portion of the light-shielding pattern partially overlaps a gate region and a storage node contact region of an active region disposed on a semiconductor substrate. The semiconductor device includes an active region and a device isolation region defining the active region disposed in a semiconductor substrate, a gate electrode, wherein a line width of the gate electrode in the active region is greater than that in the device isolation region, and a zigzag W-STAR gate region, wherein the waved portion of the zigzag W-STAR gate region partially overlaps the gate region and the storage node contact region in the active region.

3 Claims, 6 Drawing Sheets

PHOTO MASK AND SEMICONDUCTOR DEVICE FABRICATED USING THE SAME

BACKGROUND OF THE INVENTION

1. Field of the Invention

The present invention generally relates to a photo mask and a semiconductor device fabricated using the same, and more specifically, to a photo mask and a semiconductor device fabricated using the same wherein a zigzag waved step asymmetry recess ("W-STAR") gate region is disposed in a semiconductor substrate via a photolithography method using a zigzag W-STAR photo mask corresponding to a predetermined region disposed in the semiconductor substrate partially overlapping a storage node contact region and a gate region in an active region to decrease sheet resistance for a storage node contact and to increase a gate channel length, thereby improving a gate leaning phenomenon.

2. Description of the Related Art

Generally, a gate causes a problem such as a Short Channel Effect ("SCE") as the semiconductor device is highly integrated.

To solve the problem, a step asymmetry recess ("STAR") gate region is introduced in order to improve a refresh characteristic and a gate channel length of the semiconductor device in a MOSFET fabrication. A stepped gate is disposed on the STAR gate region. A predetermined region of the STAR gate region is etched via a lithography method using a STAR photo mask, wherein the predetermined region overlaps a storage node contact region and a portion of a gate region adjacent thereto.

FIG. 1 is a top view illustrating a conventional photo mask.

Referring to FIG. 1, a photo mask 10 has a light-transmitting pattern 15 and a light-shielding pattern 13. The light-shielding pattern 13 disposed on a transparent substrate 11 corresponds to a predetermined region disposed on the semiconductor substrate overlapping the storage region contact region and a portion of the gate region adjacent thereto. The light-shielding pattern 13 defines a STAT gate region disposed in the semiconductor substrate.

FIG. 2 is a layout of a conventional semiconductor device.

Referring to FIG. 2, a predetermined region 40 of the semiconductor substrate 20 corresponding to the light-shielding pattern 13 disposed on the photo mask 11 is the recessed STAR gate region, wherein the predetermined region 40 overlaps the storage node contact region 30 and a portion of the gate region 35 adjacent thereto.

FIG. 3 is a cross-sectional view taken along the line I-I' of FIG. 2 illustrating the conventional semiconductor device.

Referring to FIG. 3, a device isolation film 23 defining the active region is disposed in the semiconductor substrate 20. The recessed STAR gate region is disposed within the STAR gate region 55 via a photolithography method using the STAR photo mask 10 of FIG. 1. The recessed STAR gate region includes the storage node contact region and a portion of the gate region adjacent thereto.

In accordance with the conventional photo mask and semiconductor device, a stepped gate is disposed on the STAR gate region. The recessed STAR gate region is formed via a photolithography method using a line/space photo mask overlapping the storage node contact region and a portion of the gate region adjacent thereto disposed on the semiconductor substrate.

However, a lower step of the stepped gate causes more shrinkage phenomenon during the subsequent heat treatment process after the formation of a polysilicon layer for a gate electrode. As a result, there is a gate leaning problem such as the gate collapsing toward the storage node contact region.

SUMMARY OF THE INVENTION

It is an object of the present invention to provide a photo mask and a semiconductor device fabricated using the same wherein a zigzag waved step asymmetry recess ("W-STAR") gate region is disposed in a semiconductor substrate via a photolithography method using a zigzag W-STAR photo mask corresponding to a predetermined region disposed in the semiconductor substrate partially overlapping a storage node contact region and a gate region in an active region to decrease sheet resistance for a storage node contact and to increase a gate channel length, thereby improving a gate leaning phenomenon.

In order to achieve the object of the present invention, there is provided a photo mask to form a mask pattern defining a STAR gate region, comprising a transparent substrate, and a light-shielding pattern defining a zigzag W-STAR gate region, wherein a waved portion of the light-shielding pattern partially overlaps a gate region and a storage node contact region of an active region disposed on a semiconductor substrate.

In order to achieve another object of the present invention, there is provided a semiconductor device, comprising an active region and a device isolation region defining the active region disposed in a semiconductor substrate, a gate electrode, wherein a line width of the gate electrode in the active region is greater than that in the device isolation region, and a zigzag W-STAR gate region, wherein the waved portion of the zigzag W-STAR gate region partially overlaps the gate region and the storage node contact region in the active region.

DETAILED DESCRIPTION OF THE EXEMPLARY EMBODIMENTS

Reference will now be made in detail to exemplary embodiments of the present invention. Wherever possible, the same reference numbers will be used throughout the drawings to refer to the same or like parts.

Figure 1:
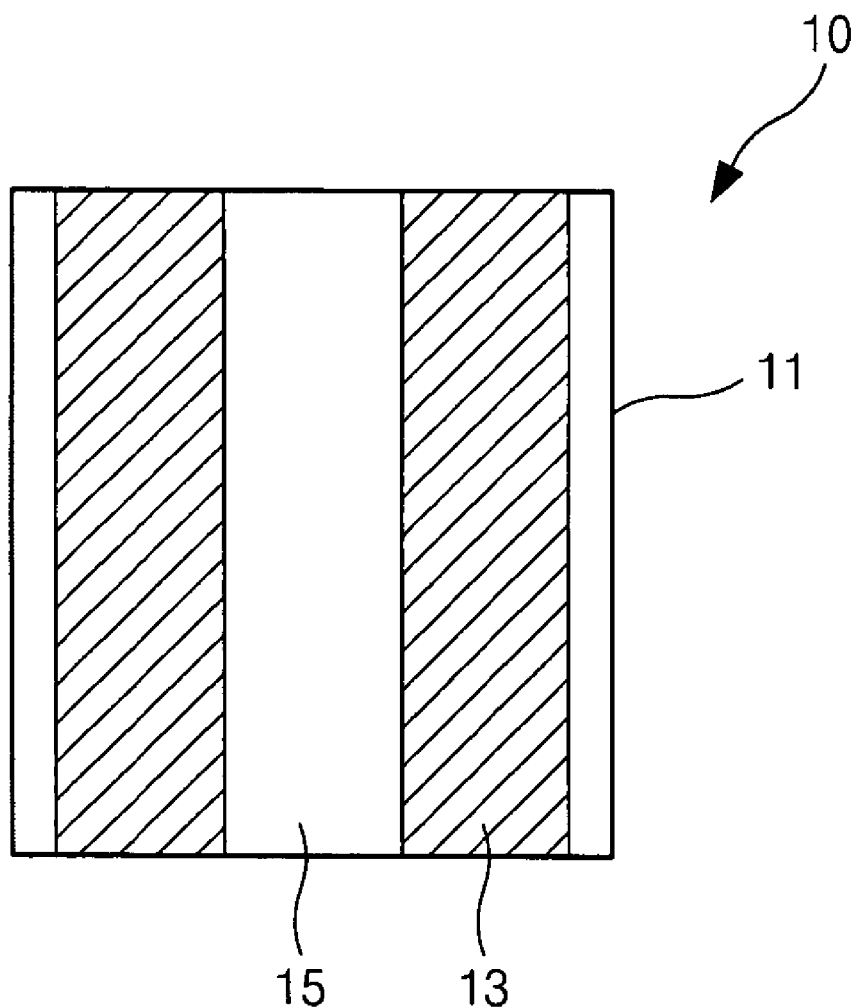
FIG. 1 is a top view illustrating a conventional photo mask.
Figure 2:
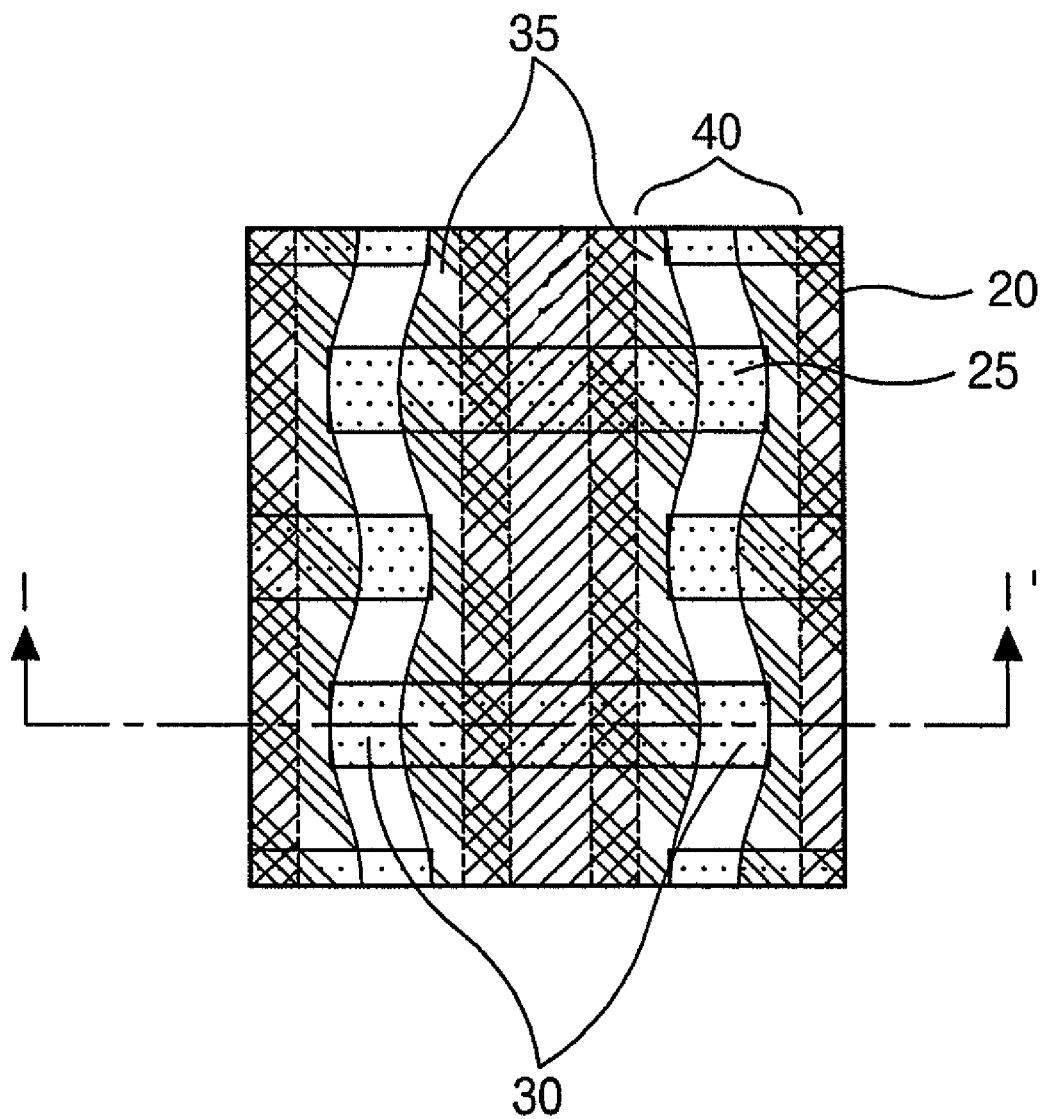
FIG. 2 is a layout of a conventional semiconductor device.
Figure 3:
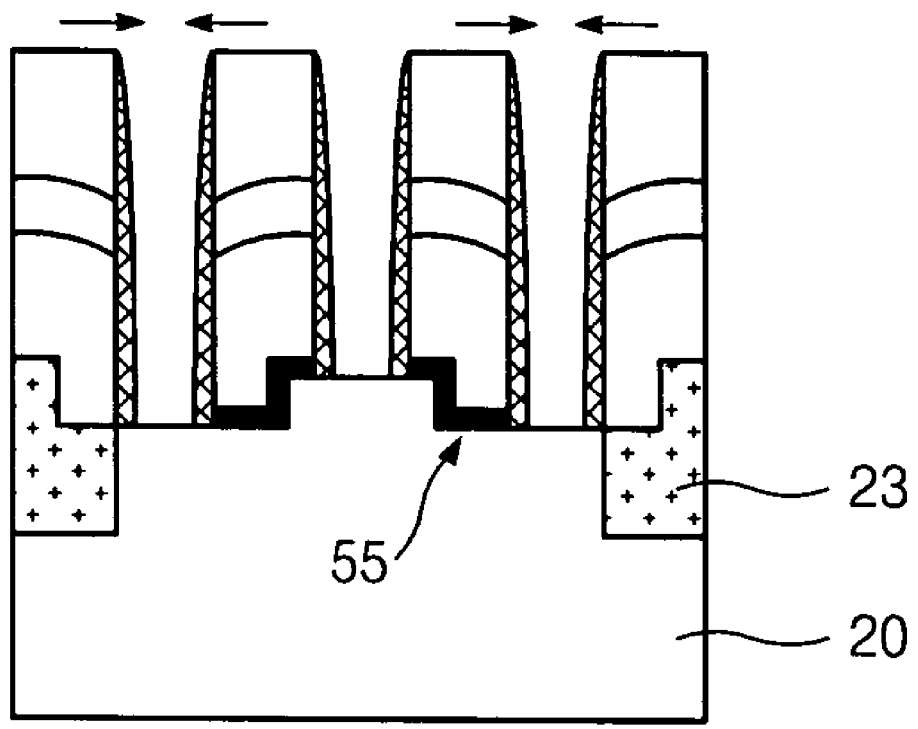
FIG. 3 is a cross-sectional view illustrating a conventional semiconductor device.
Figure 4:
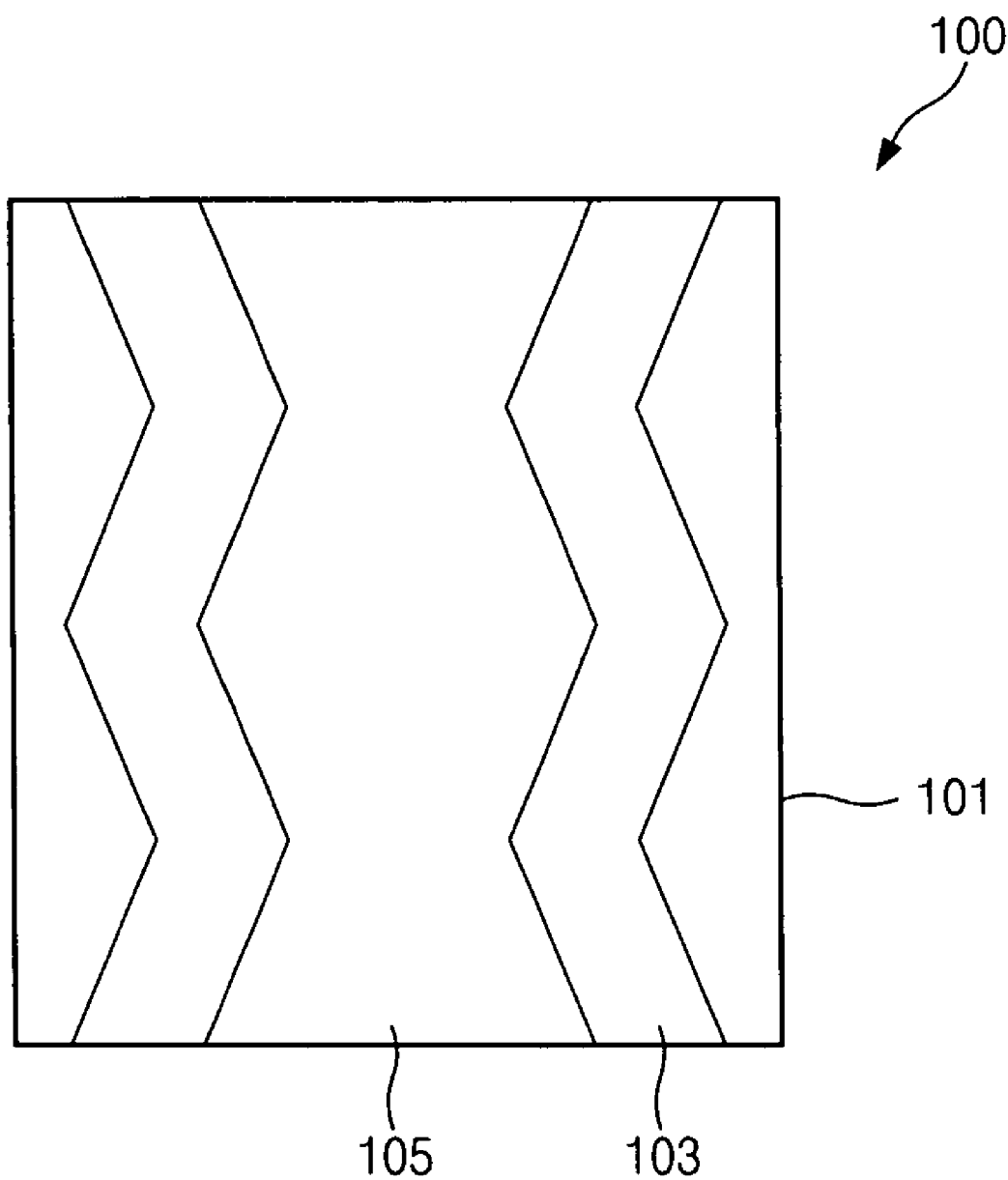
FIG. 4 is a top view illustrating a photo mask according to a preferred embodiment of the present invention.

FIG. 4 is a top view illustrating a photo mask according to a preferred embodiment of the present invention.

Referring to FIG. 4, a photo mask 100 to form a mask pattern defining a STAR gate region in accordance with a preferred embodiment of the present invention, has a light-transmitting pattern 105 and a light-shielding pattern 103. The light-shielding pattern 103 disposed on a transparent substrate 101 corresponds to a predetermined region disposed on the semiconductor substrate partially overlapping a storage region contact region and a gate region adjacent thereto in an active region.

Preferably, the photo mask 100 is selected from a binary mask, a halftone PSM having a transparency ranging from 4% to 10% or combinations thereof.

Figure 5:
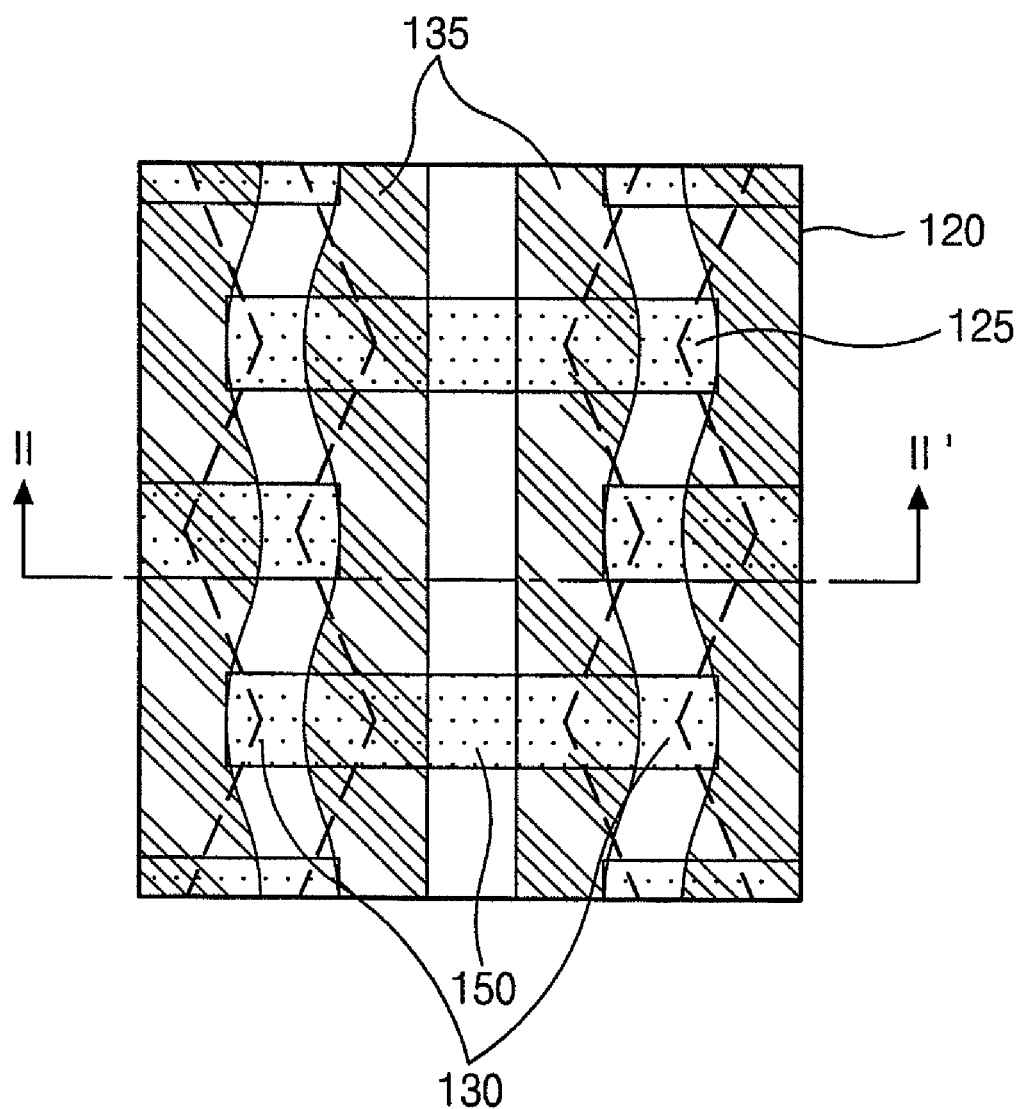
FIG. 5 is a layout of a semiconductor device according to a preferred embodiment of the present invention.

FIG. 5 is a layout of a semiconductor device according to a preferred embodiment of the present invention.

Referring to FIG. 5, the layout comprises an I-type active region 125 and a device isolation region defining the active region 125, a gate electrode region 135 having a line width thereof in the active region greater than that in the device isolation region, and a zigzag W-STAR gate region.

Preferably, a waved portion of the zigzag W-STAR gate region partially includes a storage node contact region and a gate region adjacent thereto in the active region 125. Preferably, a depth of the recessed region in the W-STAR gate region also ranges from 400 Å to 700 Å, and an interior angle of the recessed region in the W-STAR gate region ranges from 90° to 140°.

Figure 6:
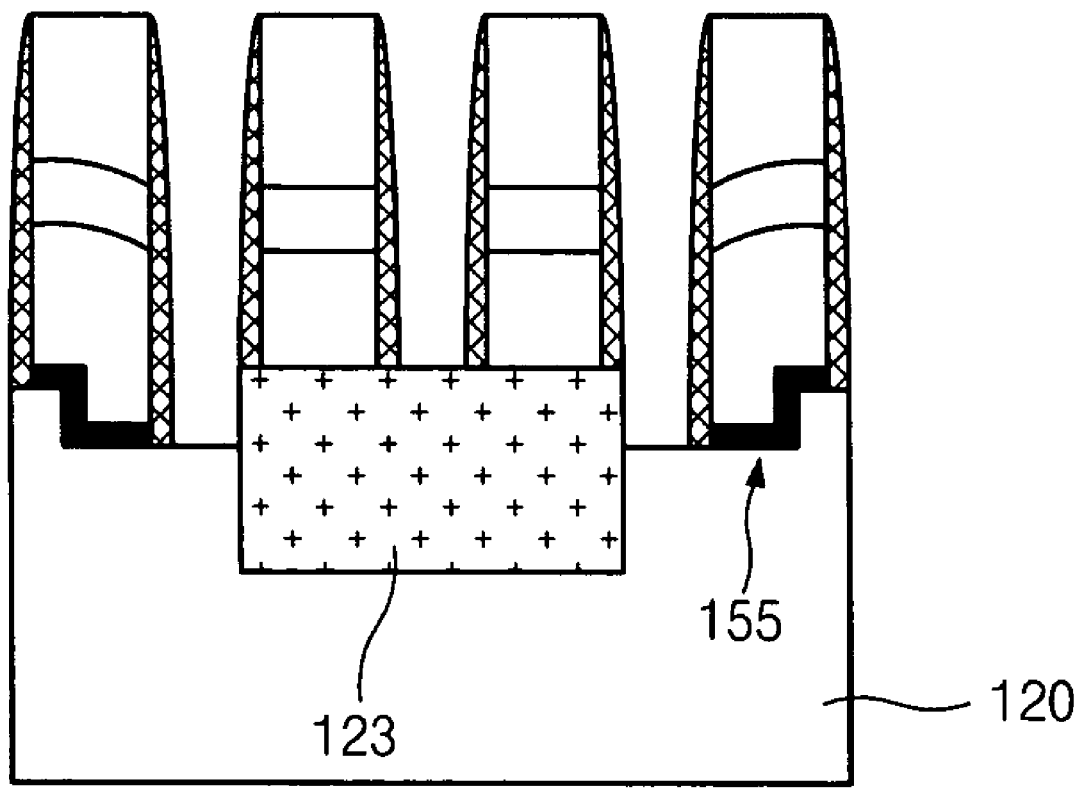
FIG. 6 is a cross-sectional view illustrating a semiconductor device according to a preferred embodiment of the present invention.

FIG. 6 is a cross-sectional view taken along the line II-II' illustrating the semiconductor device according to a preferred embodiment of the present invention.

Referring to FIG. 6, the device isolation region 123 defining the active region is disposed in a semiconductor substrate 120. A recessed W-STAR gate region is disposed on the W-STAR gate region 155 via a lithography method using the zigzag W-STAR photo mask 100 as shown in FIG. 4. The recessed W-STAR gate region partially includes the storage node contact region and a gate region adjacent thereto in the active region. A stepped gate is disposed on the W-STAR gate region 155.

In accordance with a preferred embodiment of the present invention, the semiconductor device has a stepped gate disposed on the active region and a plane gate disposed on a device isolation film to increase a gate channel length in the active region and a surface area of the storage node contact region, thereby improving a sheet resistance for the storage node contact region and the gate leaning phenomenon.

As described above, the semiconductor device in accordance with the preferred embodiment of the present invention provides the improved characteristics and reliability of the semiconductor device by increase in the gate channel length in the active region and by decrease in the sheet resistance for the storage node contact region.

The foregoing description of various embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated.

What is claimed is:

1. A semiconductor device, comprising
   an active region and a device isolation region defining the active region disposed in a semiconductor substrate;
   a gate electrode, wherein a line width of the gate electrode in the active region is greater than a line width of the gate electrode in the device isolation region; and
   a zigzag waved step asymmetry recess region formed under the gate electrode,
   wherein a waved portion of the zigzag waved step asymmetry recess region partially overlaps the gate electrode and a storage node contact region in the active region,
   wherein the zigzag waved step asymmetry recess region is not formed in the device isolation region.

2. The semiconductor device according to claim 1, wherein a depth of the waved step asymmetry recess region ranges from 400 Å to 700 Å.

3. The semiconductor device according to claim 1, wherein an interior angle of the waved step asymmetry recess region ranges from 90° to 140°.

\* \* \* \* \*